United States Patent [19]

Yokoyama

[11] 4,068,188

[45] Jan. 10, 1978

[54] PHASE LOCKED LOOP CIRCUIT

[75] Inventor: Takao Yokoyama, Kodaira, Japan

[73] Assignee: Hitachi, Ltd., Japan

[21] Appl. No.: 768,840

[22] Filed: Feb. 15, 1977

[30] Foreign Application Priority Data

Feb. 16, 1976 Japan ................................. 51-14895

[51] Int. Cl.² ............................................... H03B 3/04
[52] U.S. Cl. .......................................... 331/8; 331/16; 331/113 R; 331/177 R
[58] Field of Search ................. 331/8, 16, 111, 113 R, 331/177 R

[56] References Cited

U.S. PATENT DOCUMENTS

| 3,821,658 | 6/1974 | Hoeft | 331/8 |
| 3,857,110 | 12/1974 | Grebene | 331/8 |
| 3,869,679 | 3/1975 | Grebene | 331/8 |
| 3,870,971 | 3/1975 | Takahashi et al. | 331/111 |
| 3,946,330 | 3/1976 | Takahashi | 331/111 |

Primary Examiner—John Kominski
Attorney, Agent, or Firm—Craig & Antonelli

[57] ABSTRACT

Phase locked loop (PLL) circuit comprises, a phase detector including first and second cascade-connected differential pairs of transistors constituting an analog multiplier with each one of the differential pair transistors supplied with two inputs, a low pass filter for converting the detection output into a D.C. control voltage, and an emitter-coupled multivibrator including constant current sources for determining the oscillation frequency with a timing capacitor. The PLL circuit is provided with constant current adjusting means for variably setting or determining the current through a constant current source connected to the second differential pair of transistors and the currents through the current sources determining the oscillation frequency in a correlated manner through a common variable resistor. Thereby, dispersions in the loop gain of the PLL circuit are reduced.

9 Claims, 4 Drawing Figures

PHASE LOCKED LOOP CIRCUIT

This invention relates to a phase locked loop (PLL) circuit, and more particularly to a PLL circuit formed of a monolithic semiconductor integrated circuit (IC).

The PLL circuit has recently become a very effective and advantageous technique from both viewpoints of cost and circuit design due to the introduction of IC techniques and particularly to the advances in IC manufacturing techniques and has attracted much attention, as may be seen in the application to frequency synthesizers. Thus, the adoption of the PLL circuit is expected in various fields such as the automatic frequency control of FM multiplexers and TV sets and the revolution speed control of motors. Brief description of the principle of the PLL circuit will be made hereinbelow referring to FIG. 4.

As shown in the block diagram of FIG. 4, a PLL circuit comprises a servo loop including a phase comparator 1, a low pass filter 2, and a voltage-controlled free-running oscillator (VCO) 3. The phase comparator 1 compares the phases of two inputs and generates a voltage corresponding to the phase error.

In this PLL circuit, when there is no input signal $V_i$, the phase comparator 1 generates no output and the oscillator 3 supplies an oscillation output $V_o$ of the free-running frequency $f_o$.

When an input signal $V_i$ of frequency $f_i$ is applied, the low pass filter 2 integrates the output of the phase comparator 1 and converts the phase-error into a D.C. signal $V_d$. This phase detection output voltage $V_d$ is proportional to the phase difference between the input frequency $f_i$ and the oscillation frequency $f_o$, and is applied to a control terminal of the VCO circuit 3. This controlling voltage $V_d$ is applied to the oscillator circuit in such a manner that the oscillation frequency $f_o$ of the oscillator 3 is changed nearer to the input frequency $f_i$. Thus, the output frequency $f_o$ approaches the input frequency $f_i$ and finally becomes equal, $f_o = f_i$. This state is called the "locked state". Once the circuit is locked, the oscillation frequency of the oscillator circuit 3 becomes always equal to the input frequency. The low pass filter 2 also has a function of maintaining the controlling voltage $V_d$ when the phase comparator 1 does not generate any phase difference or phase error, i.e. when the PLL circuit is locked. When there is generated a phase difference in the locked state, the circuit generates a controlling signal which brings the output oscillation frequency $f_o$ nearer to the input frequency $f_i$.

Now let the detection sensitivity (i.e., gain) of the phase comparator be $\mu$ (V/rad), the transfer characteristic of the low pass filter $F(s)$, the oscillation control sensitivity (i.e., gain) of the oscillator $\beta$ (rad/V.sec) and the total loop gain of the PLL $K_v = \mu \cdot \beta$. Then, using Laplace transformation, the transfer function $H(s)$ representing the relation between the phase $\theta_i(s)$ of the input signal $V_i$ and the phase $\theta_o(s)$ of the output signal $V_o$ can be represented as $$H(s) = \frac{\theta_o(s)}{\theta_i(s)} = \frac{K_v \cdot F(s)}{s + K_v \cdot F(s)} \quad (1),$$

where $s$ is the Laplace operator, $s = jw$.

This equation (1) becomes the basic formula of the PLL. As can be seen from the formula (1), the transfer characteristic of the PLL circuit is greatly influenced by the total loop gain $K_v$ and the transfer characteristic $F(s)$ of the low pass filter.

In practical use, the transfer characteristic of a PLL circuit is determined by the loop gain $K_v$ which is the product of the detection sensitivity $\mu$ and the control voltage sensitivity $\beta$. In the conventional PLL circuit, such a circuit structure was adopted that the detection sensitivity $\mu$ and the control voltage sensitivity $\beta$ can be independently selected. Then, unevenness, fluctuations, or dispersions may arise in both the detection sensitivity $\mu$ of the phase comparator and the control voltage sensitivity $\beta$ of the VCO circuit mainly due to the manufacturing processes, the ambient temperature and the time drift of the circuit parameters.

For example, since compensation for fluctuations or variations in the capacitance of a timing capacitor of the VCO is accomplished by adjusting the bias voltage or constant current of the VCO, the control voltage sensitivity $\beta$ is subjected to fluctuations or variations. Thus, the product of the detection sensitivity $\mu$ and the control voltage sensitivity $\beta$ and hence the gain of the total loop of the PLL circuit $K_v$ may be subjected to even larger fluctuations or variations.

The PLL circuit has a complicated structure. For reducing the cost of manufacture, integration of the circuit into an LSI and mass production of such an LSI are being developed. In such a case, there has been provided no means for compensating for the variations in the gain. Thus, it has been difficult to provide PLL circuits of uniform performance and quality.

Therefore, this invention aims to solve the above problems and an object of this invention is to provide a PLL circuit having a predetermined uniform loop gain.

Another object of this invention is to provide a PLL circuit having a common current adjusting means for associatively adjusting the valves of all the currents flowing through constant current sources in the circuit to thereby enable the reduction of dispersions in the loop gain.

A further object of this invention is to provide a PLL circuit easily integrated into an IC and having a stable loop gain.

According to an aspect of this invention, there is provided a phase locked loop circuit comprising a phase detector including an analog multiplier formed of a transistor differential amplifier for detecting the phase difference of two input signals through a constant current source connected to the differential amplifier, a low pass filter for integrating the phase difference output of the phase detector and converting it into a D.C. voltage, and a voltage-controlled oscillator generating an oscillation frequency determined by the capacitance of a timing capacitor and currents flowing through constant current sources connected respectively to both ends of the timing capacitor and controlled by the D.C. voltage output of the low pass filter and feeding back the oscillation output as one of the two input signals, the phase locked loop circuit comprising a common constant current determining means including resistive means for correlatively adjusting and maintaining the currents flowing through the constant current source connected to the differential amplifier and through the constant current sources connected to the timing capacitor of the oscillator to be equal or at a predetermined ratio.

The above and other objects, features and advantages of this invention will become apparent from the following detailed description of the invention when taken in conjunction with the accompanying drawings, in which:

FIG. 1 shows a basic embodiment of the PLL circuit for illustrating the basic principle of this invention.

Figure 1:
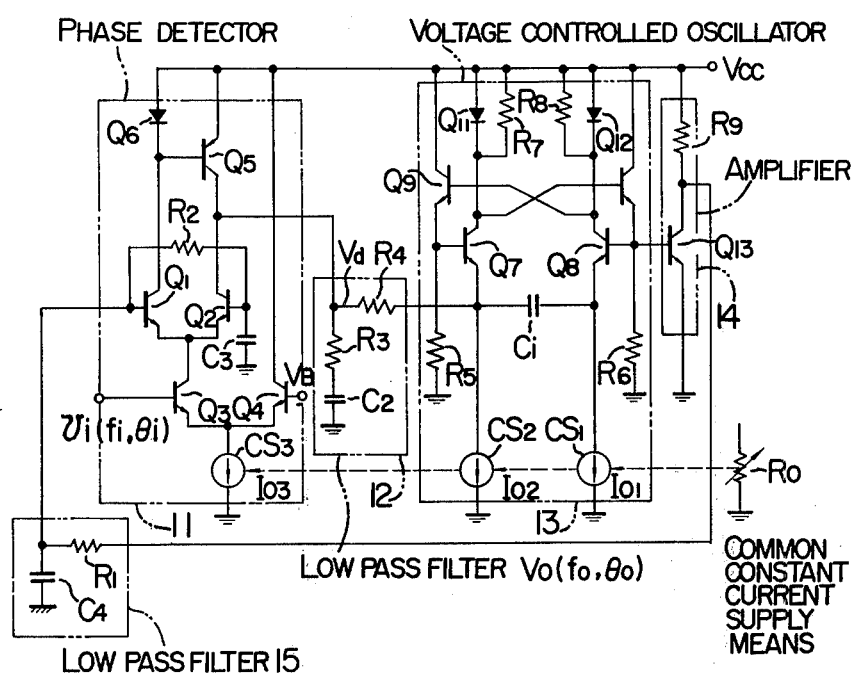
FIG. 1 is a schematic circuit diagram of a PLL circuit according to a basic embodiment of this invention.

In the Figure, the PLL circuit comprises a phase detector 11, a low pass filter 12, a voltage-controlled oscillator i.e., VCO 13, an amplifier 14 and a feed-back low pass filter 15. The phase detector 11 comprises a first pair of differential transistors $Q_1$ and $Q_2$ and a second pair of differential transistors $Q_3$ and $Q_4$ coupled in cascade connection to the first pair. A constant current load circuit is formed of a transistor $Q_5$ and a diode $Q_6$. The circuit of this type is also called a phase comparator of analog multiplier type. In this circuit, balancing of the respective differential amplifiers is very important. When integrated into an IC, the respective transistors are formed in a single semiconductor chip and hence can be formed with very small dispersion of the characteristics. This is a notable merit of integrating the PLL circuit into an IC as well as a possible reduction in the manufacturing cost.

The base of one transistor $Q_1$ of the first differential pair of transistors is supplied with the oscillation signal $V_o$ of the oscillator circuit 13 through the low pass filter 15 which is different from the low pass filter 12 for integrating the phase difference output of the phase detector and converting it into a D.C. signal. On the other hand, the base of one transistor $Q_3$ of the second differential pair of transistors is supplied with an input signal $V_i$. This, a current output signal corresponding to the momentary phase difference of these two input signals is provided at the collector of the transistor $Q_2$. A capacitor $C_3$ connects the base of the other transistor $Q_2$ of the first differential pair of transistors to ground therethrough so as to shunt the A.C. components. Thus, no A.C. singal is applied to the base of this transistor $Q_2$. The phase detection output of the phase detector 11 is applied to the low pass filter 12 comprising resistors $R_3$ and $R_4$ and a capacitor $C_2$ to provide a D.C. control voltage $V_d$ at the output of the filter for controlling the oscillation frequency of the voltage-controlled oscillator circuit 13. The voltage-controlled oscillator 13 of emittercoupled multivibrator type comprises transistors $Q_7$ to $Q_{10}$, diodes $Q_{11}$ and $Q_{12}$ for shifting the voltage level, resistors $R_5$ to $R_8$, a timing capacitor $C_1$ and constant current sources $CS_1$ and $CS_2$. The operation of this voltage-controlled oscillator 13 will be described briefly hereinbelow. Assuming that the transistor $Q_7$ is turned on and the transistor $Q_8$ is turned off in the initial state, the timing capacitor $C_1$ is charged from the side of the emitter of the transistor $Q_7$. Then, the potential at the emitter of the transistor $Q_7$ increases while that of the transistor $Q_8$ decreases. When the decrement of the potential exceeds the threshold voltage $V_{BE}(ON)$ with respect to the base potential of the transistor $Q_8$, the transistor $Q_8$ becomes turned on and hence the transistor $Q_7$ turned off. Thus, the collector potentials of the transistors are reversed to charge the capacitor $C_1$ from the side of the transistor $Q_8$. Similar operation is repeated to generate an oscillation output.

The details of the emitter-coupled multivibrator circuit of this type are disclosed in "The monolithic phase-locked loop — a versatile building block", IEEE, Spectrum, pages 38 to 49, March 1971.

The emitter-coupled multivibrator of this type has an excellent linearity over a wide frequency range and is suited for use in the voltage-controlled circuit of a phase-locked loop which is required to have a stable free-running frequency.

Letting the capacitance of the timing capacitor $C_1$ be $C_1$ and the currents $I_{o1}$ and $I_{o2}$ flowing through the constant current sources $CS_1$ and $CS_2$ connected respectively to both ends of the timing capacitor $C_1$ be both $I_o$, the free-running frequency $f_o$ of the oscillation output $V_o$ of the VCO circuit 13 is given by $$f_0 = \frac{I_0}{4 V_{BE} C_1} \quad (2),$$

where $V_{BE}$ is the forward voltage between the base and the emitter of the transistor, which is about 0.7 V. The control voltage $V_d$ is applied to the emitter of the transistor $Q_7$ which works as the control input terminals of the oscillator circuit 13 so as to control the phase of the oscillation output $V_o$ of the VCO 13. The oscillation output $V_o$ is also applied to the base electrode of one transistor $Q_1$ of the first differential pair of transistors through the amplifier 14 including a common emitter amplifying transistor $Q_{13}$ and the low pass filter 15 to constitute a loop. The voltage-controlled oscillator stage may include a voltage stabilizer for supplying a constant line voltage regardless of the variations in the commericial power source voltage.

In the circuit of this embodiment, a common adjusting potentiometer or variable resistor $R_o$ is provided to adjust or set the values of the constant curents $I_{o1}$ and $I_{o2}$ flowing through the constant current sources $CS_1$ and $CS_2$ connected respectively to the two ends of the timing capacitor $C_1$ at $I_o$ and simultaneously the value of the constant current $I_{o3}$ flowing through the constant current source $CS_3$ connected to the emitters of the second differential pair of transistors $Q_3$ and $Q_4$ also at $I_o$ in accordance with the change in the currents $I_{o1}$ and $I_{o2}$ in order to eliminate the dispersion of the loop gain $K_v$ of the PLL due to the dispersion in the quality of the constituent components, such as the timing capacitor, in manufacture and in time change and to the absence of correlation of the currents flowing through the respective constant current sources. Therefore, when the one and the other transistors $Q_3$ and $Q_4$ of the second differential pair of transistors are brought into conductive and non-conductive states, respectively, in response to an input signal $V_i$, the current flowing through the transistor $Q_3$ of the second differential pair cascade-connected to the first differential pair of transistors $Q_1$ and $Q_2$ is also set at $I_o$.

According to the above embodiment, the objects of this invention will be achieved for the following reasons.

Since the control voltage $V_d$ is proportional to the value $I_o$ of the current $I_{o3}$ flowing through the constant current source $CS_3$ and to the phase difference between the phase $\theta_i$ of the input signal $V_i$ of frequency $f_i$ and the phase $\theta_o$ of the oscillation output signal $V_o$, the detection sensitivity of the phase detector 11 can be represented by $$\mu = A_1 \cdot I_o \tag{3}$$

where $A_1$ is a constant.

On the other hand, the oscillation control sensitivity $\beta$ can be regarded as the changes in the phase $\theta_o$ and the frequency $f_o$ of the oscillation output $V_o$ with respect to the changes in the current quantity $I_o$ of the currents. $I_{o1}$ and $I_{o2}$ flowing through the constant current sources $CS_1$ and $CS_2$ connected to the both ends of the timing capacitor $C_1$ in response to changes in the D.C. control voltage $V_d$, and it can be given by differentiating the equation (2), $$\beta = A_2 \frac{f_0}{I_0} = \frac{A_2}{4V_{BE}C_1} = \frac{f_0 A_2}{I_0} \tag{4}$$

where $A_2$ is a constant.

Since the loop gain $K_v$ of the PLL circuit is given by the product of the detection sensitivity $\mu$ of the phase detector and the oscillation control sensitivity $\beta$ of the oscillator circuit, it can be represented from equations (3) and (4) as $$K_v = A_1 A_2 f_o \tag{5}$$

It will be seen that according to this embodiment, since the currents flowing through the constant current sources connected to the phase detector and the voltage-controlled oscillator are always set at a common value $I_o$ by the resistance $R_o$ of the common potentiometer for setting the current, the loop gain $K_v$ of the PLL circuit is free from the influence of the common value $I_o$ of the currents $I_{o1}$, $I_{o2}$ and $I_{o3}$ regardless of the magnitude thereof. In particular, the variations in the free-running frequency due to the fluctuations or variations in the capacitance of the timing capacitor can be effectively compensated without changing the loop gain $K_v$ of the PLL circuit by commonly adjusting the constant currents $I_{o1}$, $I_{o2}$ and $I_{o3}$.

Thus, since the unevenness or dispersions in the loop gain $K_v$ of the PLL circuit due to the variations in the currents of a plurality of constant current sources are reduced, the dispersions in the capture range representing the frequency range of the input signal in which the non-locked PLL circuit follows the input frequency change and becomes locked, i.e. the pull-in range, becomes small. Thus, the PLL circuit may be operated in a narrow pull-in range and hence the operable frequency range of the PLL circuit may be stably set narrow. This leads to improvements in the noise rejection and spectrum resolution.

Figure 2:
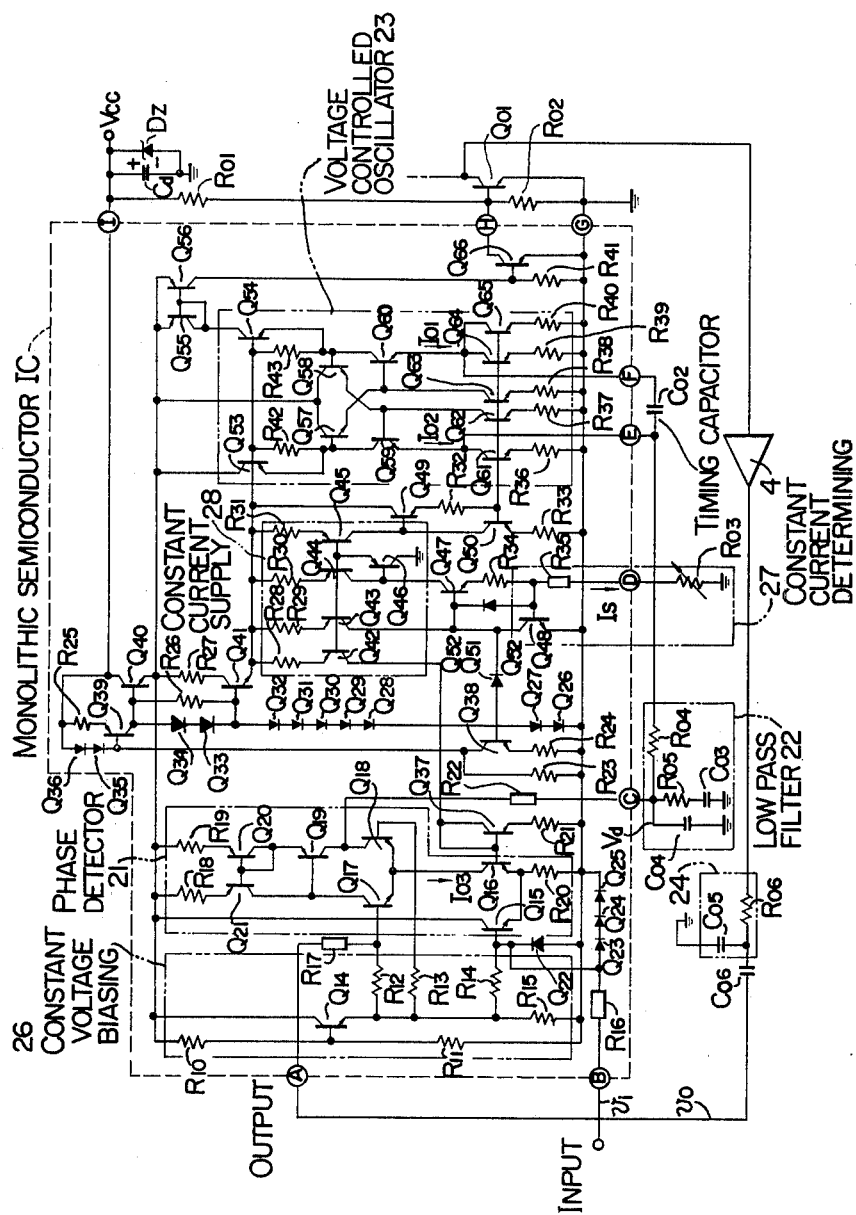
FIG. 2 is a circuit diagram of an integrated PLL circuit according to a concrete embodiment of this invention based on the circuit structure of FIG. 1.

FIG. 2 shows a more concrete embodiment having a similar basic circuit structure. In the Figure, the circuit components enclosed by the broken line are all formed in one silicon chip by known IC techniques into a monolithic semiconductor IC and are connected to external circuits through external terminals or pins A to I. The phase detector 21 and the oscillator (VCO) circuit 23 are formed in this semiconductor IC and the low pass filter 22 is formed as an external circuit.

The main part of the phase detector 21 comprises the first differential pair of transistors $Q_{17}$ and $Q_{18}$ which are supplied with the output voltage $V_o$ of the VCO circuit 23 through the pin A and the second differential pair of transistors $Q_{15}$ and $Q_{16}$ which are applied with the input voltage $V_i$ through the pin B. The base electrode of one transistor $Q_{16}$ of the second pair is biased with a voltage not greater than three times that of the base-emitter forward potential which is equal to the base bias voltage of the other transistor $Q_{15}$, i.e. $3V_{BE}$, while the base of the other transistor $Q_{15}$ is applied with the input signal $V_i$. Thereby, these second differential pair transistors perform complementary switching operations. Namely, a signal voltage having the same phase with that of the input signal $V_i$ is obtained at the collector of the other transistor $Q_{16}$ of the second differential pair of transistors. The collector of the transistor $Q_{16}$ is connected to the first differential pair of transistors $Q_{17}$ and $Q_{18}$ which are controlled by the oscillation output $V_o$. By the switching action of these transistors, a phase detection output is provided at the collector of the transistor $Q_{18}$. In the Figure, resistors $R_{10}$, $R_{11}$ and $R_{15}$, a transistor $Q_{14}$ etc. constitute a constant voltage bias circuit 26, a resistor $R_{16}$ and diodes $Q_{22}$, $Q_{23}$, $Q_{24}$ and $Q_{25}$ constitute a limiter circuit for limiting the input signal $V_i$, and transistors $Q_{19}$, $Q_{20}$ and $Q_{21}$ and resistors $R_{18}$ and $R_{19}$ constitute a load circuit.

The detection output is led through the pin C to the low pass filter 22 which is an external circuit comprising resistors $R_{o4}$ and $R_{o5}$ and capacitors $C_{o3}$ and $C_{o4}$.

Here, the capacitance of the capacitor $C_{o4}$ is selected so as to form a path for appreciably by-passing relatively high frequency signal components compared with a series-connected path formed of resistor $R_{o5}$ and capacitor $C_{o3}$. A D.C. control voltage $V_d$ formed in this low pass filter 22 is supplied to the external connecting pin E.

The voltage controlled oscillator circuit 23 is an emitter-coupled multivibrator comprising resistors $R_{36}$ to $R_{40}$ and $R_{42}$ to $R_{43}$ and transistors $Q_{53}$ to $Q_{65}$. The constant current sources $CS_1$ and $CS_2$ in the embodiment of FIG. 1 correspond to the resistors $R_{39}$, $R_{40}$ and $R_{36}$ and the transistors $Q_{64}$, $Q_{65}$ and $Q_{61}$. An external capacitor $C_{o2}$ connected between the external connecting pins E and F serves as the timing capacitor. Thus, the oscillation frequency of the VCO circuit 23 is approximately determined by the capacitance of the capacitor $C_{o2}$, the current $I_{o1}$ flowing through the transistors $Q_{64}$ and $Q_{65}$, and the current $I_{o2}$ flowing through the transistor $Q_{61}$ according to the above-mentioned equation (2). By means of varying the D.C. control voltage at the terminal E the currents $I_{o1}$ and $I_{o2}$ are varied and hence the oscillation frequency can be changed.

A transistor $Q_{48}$, a resistor $R_{35}$ and a variable resistor or potentiometer $R_{o3}$ connected to the pin D for setting or determining the current constitute a current determining circuit 27. A constant current $I_s$ given by the following equation is allowed to pass through the current determining potentiometer $R_{o3}$.

$$I_s = \frac{V_{BE}}{R_{o3} + R_{35}} \tag{6}$$

where $V_{BE}$ is the forward voltage between the base and the emitter of the transistor $Q_{48}$. This constant current $I_s$ flows through a series circuit including a resistor $R_{30}$ and a diode-connection-transistor $Q_{44}$ of the constant current supply circuit 28 and another transistor $Q_{47}$. The resistors $R_{30}$ and $R_{31}$ of the constant current supply circuit 28 are selected to have an equal resistance, say of 1 KΩ. Thus, a constant current substantially equal to the constant current $I_s$ is allowed to flow through the emitter-collector path of another transistor $Q_{45}$. Further, since resistors $R_{33}$ and $R_{36}$ are selected to have an equal resistance, say of 1 KΩ, another constant current $I_{o2}$ substantially equal to the constant current $I_s$ is allowed to flow through the emitter-collector path of a constant current source transistor $Q_{61}$. Similarly, since resistors $R_{39}$ and $R_{40}$ connected to the emitter of constant current source transistors $Q_{64}$ and $Q_{65}$ are selected to have resistances of 1 KΩ and 2 KΩ respectively, a constant current substantially equal to the constant current $I_s$ is allowed to flow through the collector-emitter path of the constant current source transistor $Q_{64}$ and a constant current substantially equal to one half the constant current $I_s$ is allowed to flow through the collector-emitter path of the constant current source transistor $Q_{65}$. Thus, the emitter-coupled multivibrator oscillator circuit 23 generates an oscillation pulse train having a duty cycle of 1 : 1.5.

Further, since resistors $R_{28}$ and $R_{30}$ of the constant current supply circuit 28 are selected to have equal resistances of 1 KΩ, constant currents, each being substantially equal to the constant current $I_s$, are allowed to pass through the emitter-collector paths of transistors $Q_{42}$ and $Q_{44}$. A transistor $Q_{37}$ having a diode connection is connected in series to the transistor $Q_{42}$ and hence allows a constant current substantially equal to $I_s$ to pass therethrough. The base of this transistor $Q_{37}$ is connected also to the base of the one transistor $Q_{16}$ of the first differential pair of transistors $Q_{15}$ and $Q_{16}$ as well as to the collector of the transistor $Q_{37}$. Resistors $R_{21}$ and $R_{20}$ connected to the emitters of the transistors $Q_{37}$ and $Q_{16}$ are selected to have resistances of 2 KΩ and 1 KΩ, respectively. Thus, a constant current $I_{o3}$ equal to two-times the constant current $I_s$ is allowed to pass through the emitter-collector path of the transistor $Q_{16}$.

In the above embodiment, the respective constant currents $I_{o1}$, $I_{o2}$ and $I_{o3}$ flowing through the constant current sources in the detection circuit 21 and the oscillator circuit 23 are correlated through the constant current supply circuit 28. Namely, the values of these constant currents $I_{o1}$, $I_{o2}$ and $I_{o3}$ are set in the term of the ratio to the constant current $I_s$ flowing through the constant current supply circuit 28. Therefore, all the constant currents $I_{o1}$, $I_{o2}$ and $I_{o3}$ can simultaneously and correlatively be adjusted simply by adjusting the current $I_s$ of the current determining circuit 27.

The oscillation output $V_o$ of the VCO circuit 23 generated at the collector of the transistor $Q_{54}$ is provided at the external connection pin H through transistors $Q_{55}$, $Q_{56}$ and $Q_{66}$. This oscillation output is led to the external connection pin A which is an input terminal of the phase detector 21 through an external transistor $Q_{o1}$, an amplifier 4, a low pass filter 24 and a coupling capacitor $C_{o6}$.

Further, in this embodiment a supply voltage $V_{cc}$ is applied through the external connection pin I to a constant voltage circuit comprising transistors (including transistors connected to function as diodes) $Q_{26}$ to $Q_{41}$ but $Q_{37}$, for reducing the effect of variations in the supply voltage $V_{cc}$. This constant voltage source supplies a constant voltage of 8 $V_{BE}$ to the phase detector 21 and the oscillator circuit 23 and another constant voltage of 6 $V_{BE}$ to the current determining circuit 27 and the constant current supply circuit 28.

Figure 3:
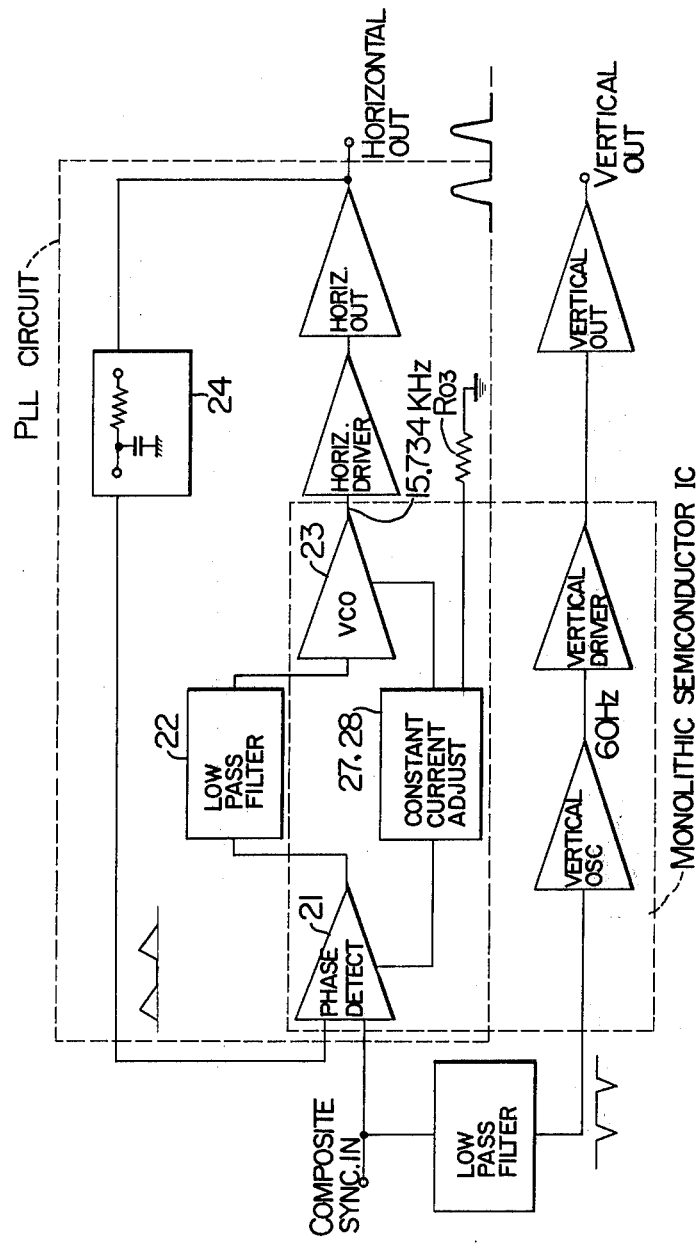
FIG. 3 is a block diagram of a circuit showing an application of the PLL circuit of FIG. 2.
Figure 4:
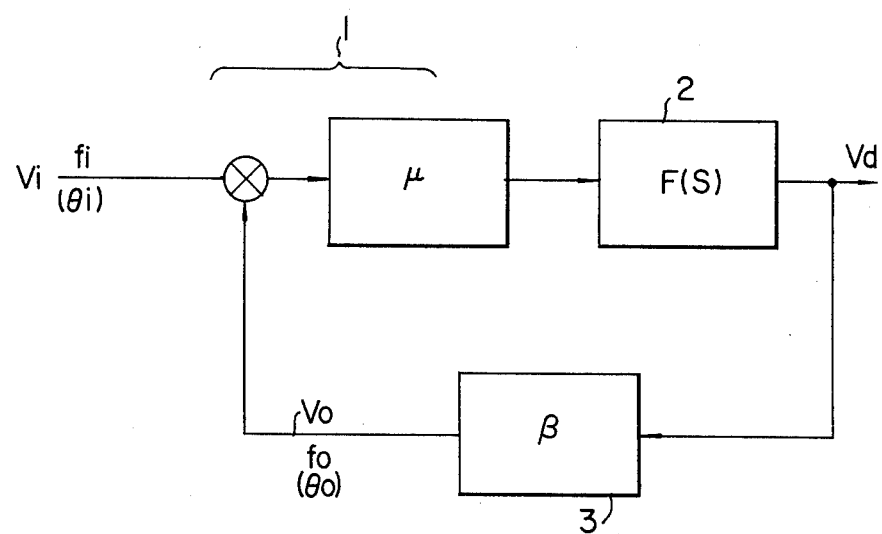
FIG. 4 is a block diagram of a fundamental PLL circuit.

FIG. 3 shows an oscillator circuit in the deflector system of color television receiver sets embodying the PLL circuit of FIG. 2. As shown in the schematic block diagram of FIG. 3, in the deflector system the oscillator circuit of the horizontal deflector is formed of a PLL circuit. The composite synchronous signal forms an input signal of the PLL circuit, which is processed through a driving amplifier corresponding to the transistor $Q_{66}$ of FIG. 2 and a horizontal deflector output stage corresponding to the amplifier $Q_{o1}$ of FIG. 2 to generate a horizontal deflection output. The frequency of this output is, for example, 15.734 KHz. This output is also fed back to the phase detector 21 of the PLL circuit through a low pass filter 24 as the other input. In this deflector system, the main part of the PLL circuit similar to the integrated part or IC portion of the PLL of FIG. 2, and the oscillator circuit and the driving amplifier of the vertical deflector are integrated in a monolithic semiconductor chip. The vertical deflection output is derived through a vertical deflection power amplifier including an external npn power transistor. The vertical oscillator receives the composite synchronous signal through another low pass filter and generates an oscillation frequency output of, for example, 60 Hz.

As can be seen from FIG. 3, the function of the deflector circuit is rather simple, but the required performance is very severe. Namely, the horizontal deflection system is required to reduce the pull-in range and suppress the temperature and time drift as small as possible. Thus, the dispersion in the loop characteristics of the PLL circuit should be very low. By the integration of the PLL circuit, the loop gain of 7.5 KHz/rad ± 10% are obtained, which include all the dispersions in the external capacitor and resistor components. To enhance the stability of the oscillation frequency of the voltage-controlled oscillator, the circuit design is so arranged that the temperature coefficients of the internal and the external circuits are as small as possible and further the total temperature coefficient becomes zero. In this embodiment including the circuit of FIG. 2, since the currents through the constant current sources $CS_1$ and $CS_3$ are adjustable simply using a common potentiometer means, variations in the loop gain $K_v$ due to the temperature and the time drift can be easily compensated and further there are no variations in the loop gain due to the relative shift of the current level in the constant current sources $CS_1$ and $CS_2$ and the constant current source $CS_3$.

In the practical use of this invention, the structure of the respective component circuits such as the constant current supply circuit and the constant current determining circuit can be altered or modified in various ways. This invention is widely applicable to PLL circuits.

What is claimed is:

1. A phase locked loop circuit comprising a phase detector including an analog multiplier formed of a transistor differential amplifier for detecting the phase difference of two input signals through a constant current source connected to said differential amplifier, a low pass filter for integrating the phase difference output of said phase detector and converting it into a D.C. voltage, and a voltage-controlled oscillator generating an oscillation frequency determined by the capacitance of a timing capacitor and currents flowing through constant current sources connected respectively to both ends of said timing capacitor and controlled by said D.C. voltage output of said low pass filter and feeding back the oscillation output as one of said two input signals, said phase locked loop circuit comprising: common constant current determining means including resistive means for correlatively adjusting and maintaining the currents flowing through said constant current source connected to said differential amplifier and through said constant current sources connected to the timing capacitor of said oscillator to be equal or at a predetermined ratio.

2. A phase locked loop circuit according to claim 1, in which said resistive means of the constant current determining means includes a potentiometer, the currents flowing through said constant current sources being simultaneously determined by the resistance of said potentiometer.

3. A phase locked loop circuit according to claim 2, in which said differential amplifier of said phase detector includes a first differential pair of transistors applied with said feed-back output as one input and a second differential pair of transistors cascade-connected to said first differential pair of transistors and applied with the other input, the base potential of that transistor of said second differential pair of transistors which is not applied with the other input is controlled by said constant current determining resistance, the constant current sources of said oscillator include a plurality of transistors, each having a collector connected to said timing capacitor, an emitter connected to a reference potential through an emitter resistance, and a base applied with a base potential controlled by said constant current determining resistance.

4. A phase locked loop circuit comprising a phase detector circuit, a low pass filter circuit and a voltage-controlled oscillator circuit, said phase detector circuit supplying a detection output signal proportional to the phase difference of the input signal and the oscillation output signal of said voltage-controlled oscillator circuit to said low pass filter, the phase of the oscillation output signal of said voltage-controlled oscillator circuit being controlled by the output signal of said low pass filter circuit, in which:

said phase detector circuit includes at least a first differential pair of transistors and a second differential pair of transistors cascade-connected with said first differential pair of transistors, the base of either one of said first differential pair of transistors being applied with one of said input signal and said oscillation output signal of said voltage-controlled oscillator circuit as two input signals and the base of either one of said second differential pair of transistors being applied with the other of said two input signals;

said voltage-controlled oscillator circuit includes at least a timing capacitor and a constant current source connected to said timing capacitor, and has the frequency of its oscillation output signal determined by the capacitance of said timing capacitor and a current flowing through said constant current source; and the current flowing through said constant current source is determined by the resistance of a variable resistor for current-setting, and simultaneously the current flowing through said one transistor of said second differential pair of transistors cascade-connected to said first differential pair of transistors of said phase detector circuit is also determined by the resistance of said current setting resistor.

5. A phase locked loop circuit according to claim 4, further comprising:

a constant current setting circuit including said current setting resistor having one end connected to ground, another resistor connected in series to the other end of said current setting resistor, and a common emitter transistor having a base connected to the interconnection point of said resistors, thereby providing a constant current in the series circuit of said resistors; and a constant current supply circuit for supplying constant currents proportional to said constant current in association with said current setting circuit;

said voltage controlled oscillator circuit comprising an emitter-coupled multivibrator, said constant current source thereof including a first and a second transistor having respective collectors connected to the both ends of said timing capacitor and a first and a second emitter resistor connected between the respective emitters and the ground, voltages proportional to the constant currents from said constant current supply circuit being applied to the bases of the respective transistors of said current sources and to the base of the other transistor of said second differential pair of transistors of said phase detector circuit.

6. A phase locked loop circuit according to claim 5, in which the output signal of said low pass filter is applied to the collector of the first transistor of said constant current source.

7. A phase locked loop circuit according to claim 6, in which said oscillator circuit includes a third transistor having an emitter grounded through a third emitter resistor and a base applied with said constant current responsive voltage, and connected in parallel to the second transistor of the constant current source of said oscillator circuit, the ratio of said first emitter resistance to said second and third emitter resistance determining the duty cycle of the oscillation output of said oscillator circuit.

8. A phase locked loop circuit according to claim 5, further comprising a constant voltage circuit comprising a voltage divider including a plurality of diode-connection-transistors connected in series to a voltage source and supplying different constant voltages determined on the basis of the emitter-base potential of the transistors for energizing said phase detector circuit, said oscillator circuit, said constant current supply circuit, and said current setting circuit.

9. An integrated circuit for a phase locked loop circuit formed in a monolithic semiconductor chip comprising:

a voltage controlled oscillator including emitter-coupled transistors serving as a multivibrator, first and second terminals for connecting an external timing capacitor, first and second transistors having collectors connected to the emitters of said emitter-coupled transistors respectively, and an emitter resistor connected between the emitter of each of said first and second transistors and ground, an oscillation output of the oscillator being derived from either collector of said emitter-coupled transistors;

a phase detector responsive to the output of said oscillator and an input signal applied to a third terminal for generating a detected signal proportional to the phase difference between the input signal and the oscillation output, said phase detector comprising, a first differential pair of transistors one of which is applied with the input signal at its base, and a second differential pair of transistors cascade-connected to said first pair of transistors, one of which is applied with the oscillation output at its base, and the emitters of each pair of transistors being coupled, the detected signal being derived from the collector of the other of said first pair of transistors and applied to the collector of said first transistor of the oscillator through an external low pass filter;

constant current adjusting means for commonly adjusting a base voltage applied to the base of the other of said second differential pair of transistors and a base voltage applied to the bases of said first and second transistors of the oscillator in a predetermined correlation, said adjusting means comprising a fourth terminal for connecting an external potentiometer to select a constant current for adjustment, and a transistor circuit responsive to the potentiometer to provide said base voltages proportional to the selected constant current at a predetermined ratio with each other, thereby constantly determining the values of a constant current flowing through said other transistor of the second pair of transistors and constant currents flowing through said first and second transistors of the oscillator in said predetermined correlation.

* * * * *